United States Patent [19]
Kang

[11] Patent Number: 5,552,338
[45] Date of Patent: Sep. 3, 1996

[54] METHOD OF USING LATCHUP CURRENT TO BLOW A FUSE IN AN INTEGRATED CIRCUIT

[75] Inventor: Wonjae L. Kang, Sunnyvale, Calif.

[73] Assignee: Intel Corporation, Santa Clara, Calif.

[21] Appl. No.: 535,540

[22] Filed: Sep. 28, 1995

Related U.S. Application Data

[63] Continuation of Ser. No. 312,140, Sep. 26, 1994, abandoned.

[51] Int. Cl.⁶ ..................... H01L 21/329; H01L 21/8238
[52] U.S. Cl. .................... 437/170; 437/57; 437/922; 148/DIG. 55
[58] Field of Search ............... 437/170, 51, 922; 148/DIG. 55

[56] References Cited

U.S. PATENT DOCUMENTS

| | | | |
|---|---|---|---|
| 4,223,277 | 9/1980 | Taylor et al. | 437/170 |
| 4,464,588 | 8/1984 | Wieser . | |
| 4,508,982 | 4/1985 | Kapral et al. | 307/572 |
| 4,816,883 | 3/1989 | Baldi . | |
| 4,905,199 | 2/1990 | Miyamoto . | |
| 4,920,398 | 4/1990 | Yoshio et al. . | |
| 4,955,038 | 9/1990 | Lee et al. | 375/35 |
| 5,126,816 | 6/1992 | Reczek et al. . | |
| 5,144,518 | 9/1992 | Miyazaki | 437/170 |

FOREIGN PATENT DOCUMENTS

| | | |
|---|---|---|
| 59-126651 | 7/1984 | Japan . |
| 62-117363 | 5/1987 | Japan . |
| 0329344 | 2/1991 | Japan . |
| 5166934 | 7/1993 | Japan . |
| 5209925 | 8/1993 | Japan . |

*Primary Examiner*—Tom Thomas
*Assistant Examiner*—Michael Trinh
*Attorney, Agent, or Firm*—Blakely, Sokoloff, Taylor & Zafman

[57] ABSTRACT

A method for blowing a fuse in an IC device using the current generated by latchup. A fuse comprising a conductive material is caused to electrically open by directing a latchup current through the conductive material. The latchup current is generated by properly biasing parasitic bipolar transistors formed within the semiconductor substrate of the IC device, causing these parasitic transistors to latch up.

1 Claim, 3 Drawing Sheets

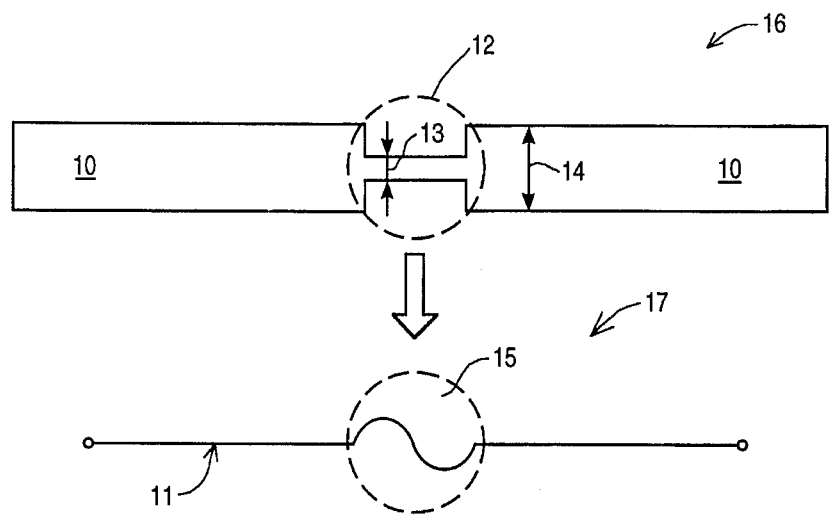
FIG_1 (PRIOR ART)
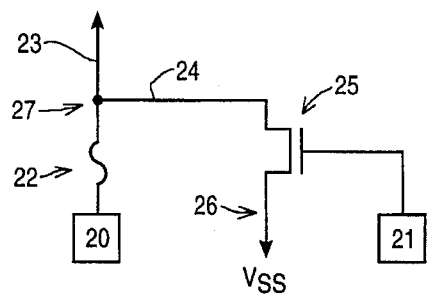
FIG_2 (PRIOR ART)
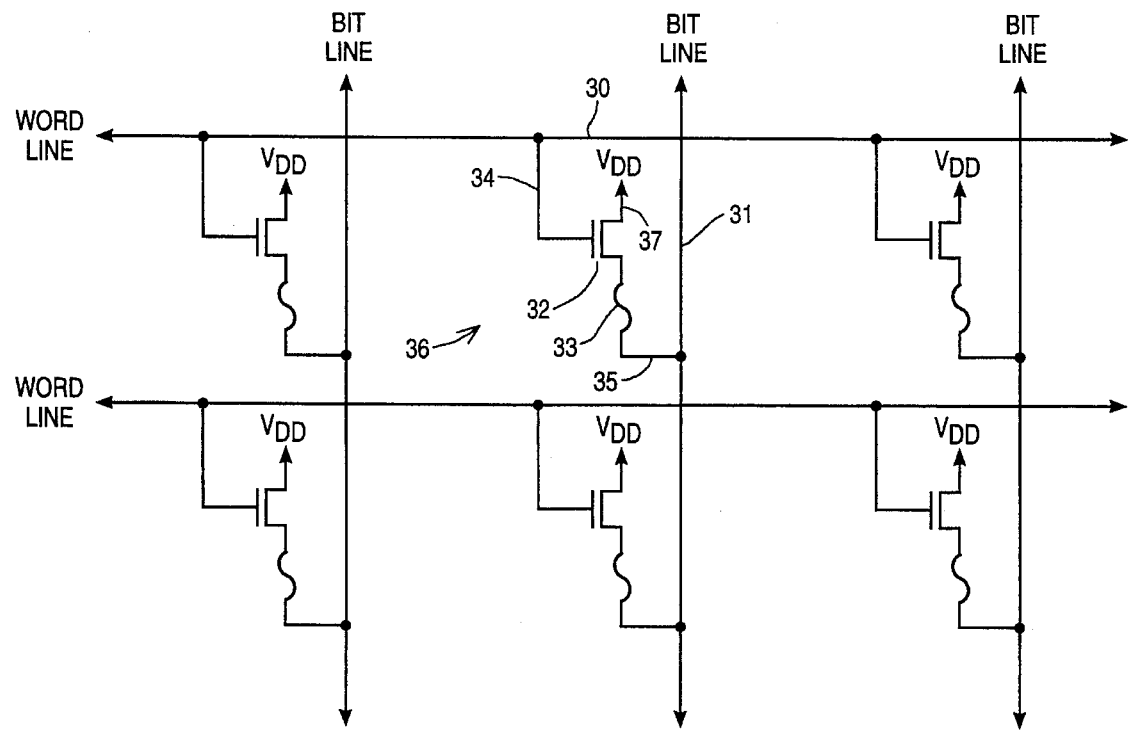
FIG_3 (PRIOR ART)

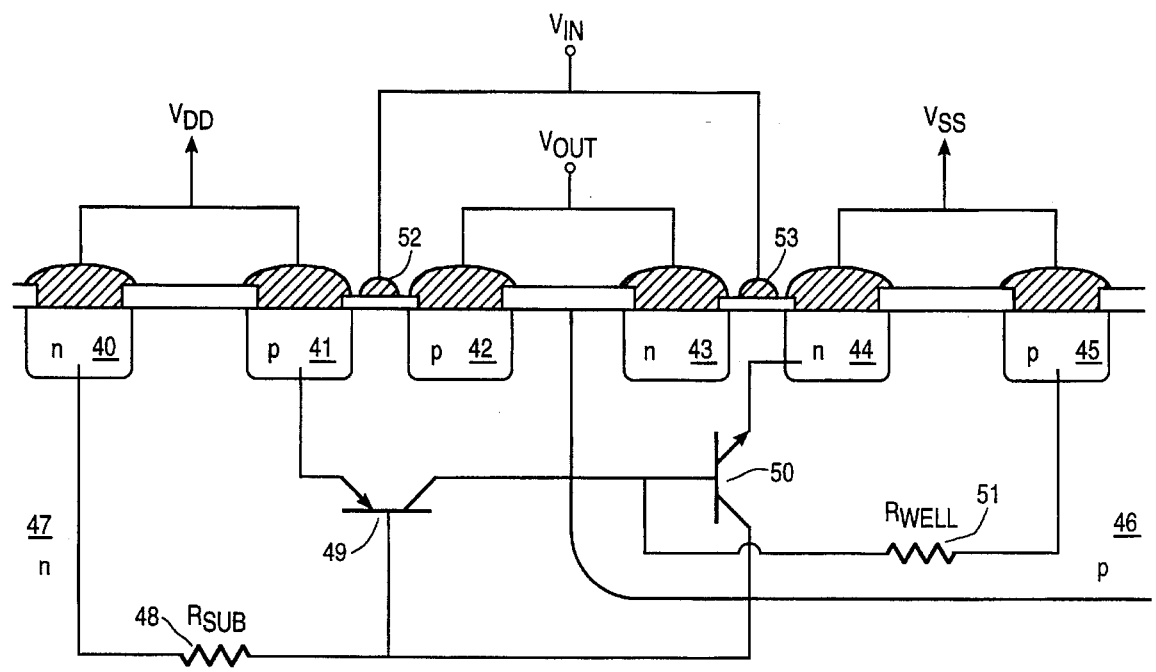
FIG_4
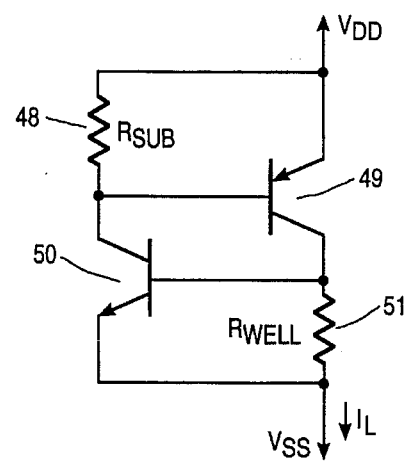
FIG_5

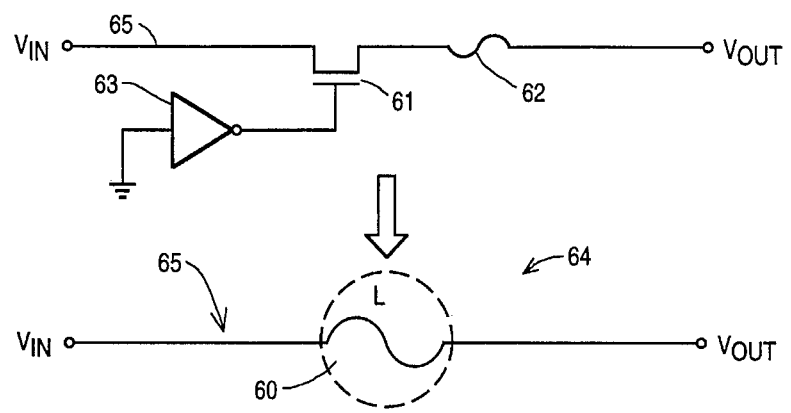
FIG_6
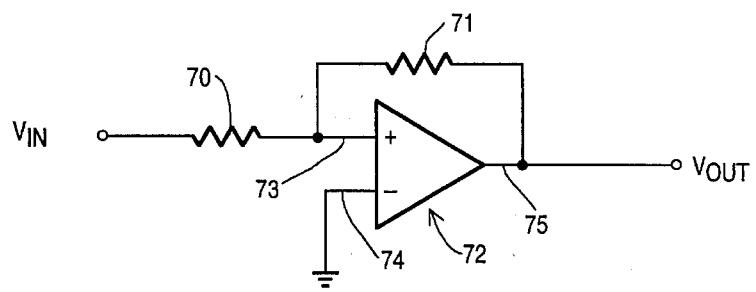
FIG_7
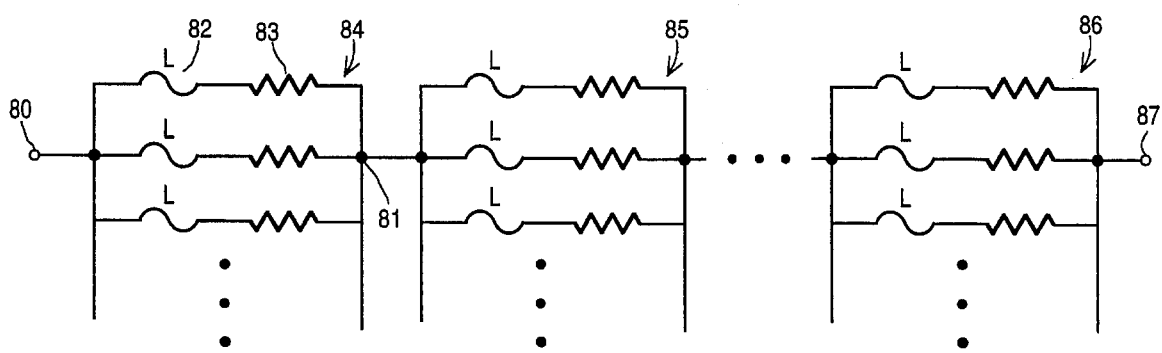
FIG_8

METHOD OF USING LATCHUP CURRENT TO BLOW A FUSE IN AN INTEGRATED CIRCUIT

This is a continuation of application Ser. No. 08/312,140, filed Sep. 26, 1994, now abandoned.

BACKGROUND OF THE INVENTION

1. Field of the Invention

The present invention relates to the field of integrated circuit design and more particularly to latchup of a CMOS circuit.

2. Background Information

Conventional CMOS (Complimentary Metal Oxide Semiconductor) technologies cannot permanently store information. During normal operation and normal biasing of a CMOS integrated circuit (IC), a general user cannot permanently store information because the CMOS circuitry cannot be physically altered in any lasting way. No matter how a CMOS IC is utilized by a general user, information stored and manipulated by the IC is entirely erased upon interruption of its power supply. In contrast, memory technologies such as Erasable Programmable Read Only Memory (EPROM) are capable of permanently storing information even in the absence of a power supply due to their ability to physically alter the location of charged particles. CMOS technology, being faster than EPROM technology, is typically used to manufacture microprocessors which are used to execute mathematical computations in a computer. EPROM technology is typically used to manufacture memory chips which store the information in a computer when the computer is turned off.

While it would be desirable for CMOS ICs to incorporate permanent memory storage capabilities, prior attempts to combine CMOS with EPROM technologies have proven to be uneconomical. However, CMOS IC designers have devised limited methods for permanently altering the physical structure of post-fabricated CMOS circuits, thereby allowing such circuits to store a small amount of information. One such method involves designing fuses into an IC and selectively blowing these fuses during operation of the IC such that the short circuits resulting from unblown fuses and open circuits resulting from blown fuses may be interpreted by the IC as permanently stored information. Unfortunately, this method of blowing fuses in an IC has heretofore had significant limitations.

FIG. 1 illustrates an IC fuse along with its schematic representation. To create a fuse in an IC, a designer must first determine the desired location of the fuse along a conductive path in the IC. As illustrated in FIG. 1, the fuse has been placed in region 12 along conductive path 10. Width 14 of interconnect line 10 outside of the narrow region 12 is approximately three to four times the width 13 within the narrow region 12. Electrons traveling through metal interconnect line 10 are forced through the narrow region 12 at a higher density than the density at which these electrons travel through the wider regions of the interconnect. Because the electrons traveling through narrow region 12 travel at a higher density, region 12 of metal interconnect line 10 is more susceptible to the effects of electromigration than are the wider regions of metal interconnect line 10.

Electromigration is a phenomenon by which conductive material is pushed down the path of electron travel by the electrons moving through the conductive material. The higher the electron density, the stronger the migration force.

As a result of electromigration of the conductive material within region 12, an open circuit will result if the current is high enough. In addition, narrow region 12 represents a higher resistance to the flow of current than does the wider region of metal interconnect line 10. As a result of this increased resistance, a high current flowing through metal interconnect line 10 can cause the conductive material within region 12 to heat up and ultimately melt away. This is another way in which an open circuit may be created within region 12 of metal interconnect line 10.

Therefore, important factors to consider in creating an open circuit are the amount of current flowing through metal interconnect line 10, the cross-sectional area as seen by such a current within region 12, and the temperature of interconnect line 10. The cross-sectional area seen by a current flowing through metal interconnect line 10 within region 12 is the product of the width 13 of region 12 times the thickness (depth into the page) of metal interconnect line 10. For conventional CMOS process technology, the width 13 may be approximately 1 micron while the thickness of metal interconnect line 10 may be approximately 3,000 Å. Assuming metal interconnect line 10 is aluminum, a current in excess of approximately 10 mA should be enough to cause an open circuit in metal interconnect line 10 within the region 12 at normal operating temperatures. Of course, increasing or decreasing the width 13 or the thickness of metal interconnect line 10 will proportionately increase or decrease, respectively, the current required to cause an open circuit within region 12. For example, approximately 20 mA would be required to cause an open circuit if the width 13 were doubled from 1 to 2 microns, and approximately 30 mA would be required if the width 13 were increase to 3 microns, etc.

Narrow region 12 of metal interconnect line 10 is a fuse. Forcing a current through region 12 which is high enough to cause an open circuit is called "blowing" the fuse. Fuse 12 in metal interconnect line 10 is represented schematically in diagram 17 by the fuse 15. Fuse 15 represents a conductive region of interconnect line 11 which is susceptible to blowing open upon subjecting interconnect line 11 to high currents.

A significant limitation of the fuse of FIG. 1 is the requirement that the metal interconnect line outside of the fuse region be wide enough to handle the large current required to blow the fuse. To be sure that the metal interconnect line outside of the fuse region is not adversely affected by such high currents, it is not uncommon for the width of these interconnect lines to be in excess of 10 microns. Similarly, transistors coupled to interconnect lines containing fuses also need to be very large in order to handle the high currents necessary to blow the fuses. This limitation severely limits the applicability of fuse blowing techniques for use in conventional CMOS circuits as described below.

FIG. 2 illustrates a circuit comprising a fuse 22 used to selectively disable contact pad 20. Contact pads 20 and 21 exist in the peripheral region of the integrated circuit device to which they are coupled. Contact pad 20 is coupled to node 27 through fuse 22. Node 27 is coupled to the drain of N channel transistor 25 through line 24. Node 27 is also coupled to the remainder of the IC device through interconnect line 23. The source of transistor 25 is tied to $V_{SS}$ while its gate is coupled to pad 21. During normal operation of the IC device, pad 21 is grounded in order to turn off transistor 25. With fuse 22 intact, electronic signals coupled to input pad 20 are transmitted through fuse 22 and through interconnect line 23 to the remainder of the integrated circuit device.

Suppose, however, that it becomes desirable to disengage pad 20 from the internal operations of the IC device. This can be accomplished by blowing fuse 22. In order to blow fuse 22, the voltage at pad 21, which is coupled to the gate of transistor 25, must be raised thereby turning on transistor 25. By turning on transistor 25, a conductive path between pad 20 and $V_{SS}$ will be established. Then, by applying high voltage to pad 20, a large current may be forced through fuse 22, blowing it open. In this manner, pad 22 may be effectively disengaged from the IC device.

As can be seen in FIG. 2, in order to blow fuse 22, it is necessary to drive a large current through the path comprising pad 20, fuse 22, node 27, interconnect line 24, transistor 25, and interconnect line 26 to $V_{SS}$. If fuse 22 is not the weakest link in this path from pad 20 to $V_{SS}$, it will not be possible to disengage pad 20. For example, if interconnect line 24 is too narrow, line 24 may blow open instead of fuse 22 upon turning on transistor 25. If this happens, the high current path will be broken between node 27 and transistor 25 before fuse 22 is blown, cutting off the high current flow through fuse 22. As a result, pad 20 will continue to be coupled to the IC device through fuse 22 and interconnect line 23. Also, note that the dimensions of transistor 25 must be large enough to reliably handle the current required to blow fuse 22. For example, if transistor 25 is too small, the source/drain resistance of the transistor will be too high, and the current through fuse 22 will be severely limited by this resistance, possibly preventing fuse 22 from blowing.

Therefore, it is necessary that interconnect lines 24, 26, and transistor 25 be large enough to reliably handle the high current required to blow fuse 22. However, by designing interconnect lines 24, 26, and transistor 25 using large dimensions, valuable area on the semiconductor substrate is used up. This reduces the packing density of the overall IC device, increasing manufacturing costs. One partial solution to this problem may be to reduce the size of transistor 25, then compensate for the increased source/drain resistance by increasing the voltage at pad 20 to drive a larger current through fuse 22. However, this would require a dual voltage supply and may only be accomplished by the IC manufacturer during testing of the IC device. As a result, circuits of the type depicted in FIG. 2 must be placed in the inactive, peripheral region of an IC device. Circuits having such wide interconnect lines and large transistor dimensions cannot be placed within the dense, active region in the interior of an IC device because the value of semiconductor "real estate" is at a premium in this active, interior region. Generally, only minimum dimension transistors and interconnect lines may be economically fabricated in the interior region of an IC device.

FIG. 3 illustrates a PROM (Programmable Read Only Memory) IC device utilizing fuses as a means for programming. Each cell in the PROM of FIG. 3 is substantially identical to its adjacent cell. Analyzing one of these cells, cell 36, it can be seen that it comprises transistor 32 whose gate is coupled through interconnect line 34 to word line 30. The drain of transistor 32 is coupled through interconnect line 37 to supply voltage $V_{DD}$ while the source of transistor 32 is coupled through fuse 33 and interconnect line 35 to bit line 31. To program cell 36 of the PROM of FIG. 3, fuse 33 is either blown or left intact. If blown, applying a high voltage to word line 30 will turn on n-channel transistor 32, but supply voltage $V_{DD}$ will not be transmitted to bit line 31 because the source of transistor 32 will be electrically isolated from bit line 31 due to the blown fuse 33. Therefore, if fuse 33 is blown, and word line 30 is selected, bit line 31 will carry a low voltage (assuming bit line 31 is biased to a low voltage) indicating a logical "0" at this bit position. If, on the other hand, fuse 33 is left intact and a high voltage is applied to word line 30, n-channel transistor 32 will turn on and pull bit line 31 up to $V_{DD}$. Therefore, when word line 30 is selected, and fuse 33 is intact, bit line 31 will be raised to a high voltage representing a logical "1" at this bit position.

In order to properly blow fuse 33, it is necessary for the interconnect lines and transistors in the high current loop between the supply voltage $V_{DD}$ and the ground plane $V_{SS}$ to be large enough to handle the current necessary to blow fuse 33. In cell 36, the high current loop used to blow fuse 33 consists of interconnect line 37 coupled to $V_{DD}$, n-channel transistor 32, fuse 33, interconnect line 35, and bit line 31 which is coupled to $V_{SS}$. Clearly, as the PROM array illustrated in FIG. 3 grows in size and complexity, it becomes impractical to use the required large dimensions for the interconnect lines and transistors in the high current loops of each cell. Using such large dimensions would severely lower the device packing density of the IC, thereby increasing manufacturing costs. In addition, because the PROM array of FIG. 3 is created in the interior, active region of the IC device, it is significantly more difficult, if not impossible, to raise the supply voltage $V_{DD}$ at a specific cell location in order to generate the current required to blow the fuse in that cell without adversely affecting circuitry elsewhere in the IC device.

What is desired is a method for blowing a fuse by using a structure which occupies only a small area in an IC device and can be blown by applying conventional voltage levels to the IC device. A designer would be able to place such a structure nearly anywhere in the IC device, including the active, internal region of the device.

SUMMARY OF THE INVENTION

A method for blowing a fuse in an integrated circuit is described. An inverter circuit is manufactured using conventional CMOS or BiCMOS technologies. By forming the n-channel transistor of the inverter in a p-region adjacent to the p-channel transistor of the inverter in an n-region, a parasitic bipolar transistor is created. This parasitic bipolar transistor may be turned on by any one of a number of methods including forward biasing a source/drain region of the p-channel or n-channel transistors, causing avalanche breakdown of the well-substrate pn junction, or causing impact ionization near the drain of the n-channel transistor. By turning on the parasitic bipolar transistor, the inverter circuit latches up, thereby causing a latchup current to flow through the semiconductor substrate. This latchup current is directed through a fuse comprising a conductive material which electrically opens upon conducting the latchup current, thereby blowing the fuse. Such a mechanism may be employed in conjunction with a variable resistance ladder in order to adjust the overall resistance of the ladder. A fuse of this type may also be used in conjunction with programming of an integrated circuit, disabling bond pads, or destroying a device for security reasons.

BRIEF DESCRIPTION OF THE DRAWINGS

The present invention is illustrated by way of example and not limitation in the accompanying figures in which:

FIG. 1 is an illustration of a fuse.

FIG. 2 is an illustration of how a fuse may be used to disable a bond pad.

FIG. 3 is an illustration of a PROM array.

FIG. 4 is an illustration of a cross-sectional view of an inverter circuit.

FIG. 5 is a schematic representation of the inverter circuit of FIG. 4 in latchup mode.

FIG. 6 is an illustration of a latchup fuse circuit.

FIG. 7 is an illustration of an operational amplifier circuit.

FIG. 8 is an illustration of a variable resistance ladder.

DETAILED DESCRIPTION

A method for blowing a fuse in an integrated circuit manufactured using conventional CMOS (Complimentary Metal Oxide Semiconductor) or BiCMOS (Bipolar Complimentary Metal Oxide Semiconductor) technologies is described. In the following description, numerous specific details such as device types, voltage levels, circuit configurations, etc., are set forth in order to provide a more thorough understanding of the present invention. It will be obvious, however, to one skilled in the art that the present invention may be practiced without employing these specific details. In other instances, well-known circuit design techniques and operations have not been described in detail in order to avoid unnecessarily obscuring the present invention.

While diagrams representing certain embodiments of the present invention are illustrated in FIGS. 4–8. These illustrations are not intended to limit the invention. The specific circuits described herein are only meant to help clarify one's understanding of the present invention and to illustrate particular embodiments in which the present invention may be implemented. It will appreciated by one skilled in the art that the broader spirit and scope of the present invention, as set forth in the appended claims, can be applied to any type of circuit which seeks the advantages associated with blowing a fuse by the method of the present invention.

When a circuit goes into latchup mode, a low resistance path is established between the supply voltage $V_{DD}$ and the $V_{SS}$ node (which is usually grounded). By effectively shorting $V_{DD}$ to $V_{SS}$ in latchup mode, a very large current is caused to flow through the IC. Circuit designers have invested much effort towards eliminating the occurrence of latchup in ICs. In contrast, the present invention describes a method in which latchup may be used to the benefit of the IC designer and user. In accordance with the present invention, this large latchup current is directed through a conductive material comprising a fuse such that the latchup current causes the fuse to electrically open.

FIG. 4 illustrates a cross-section of a semiconductor substrate in which an inverter circuit has been formed. While the substrate of FIG. 4 may be created by forming a p-well 46 within an n-type substrate 47, it is to be appreciated by one skilled in the art that an analogous circuit may be created by forming an n-well within a p-type substrate. Supply voltage $V_{DD}$ is coupled to n-type substrate 47 through n-type substrate tap 40. $V_{DD}$ is also coupled to the source 41 of the p-channel transistor comprising source 41, gate 52, and drain 42. $V_{SS}$, which is generally grounded, is coupled to the p-type well tap 45 of p-well 46. $V_{SS}$ is also coupled to the source 44 of the n-channel transistor comprising source 44, gate 53, and drain 43. The input voltage to the inverter circuit $V_{IN}$ is coupled to the gates 52, and 53 of the p-channel and n-channel transistors, respectively. The output voltage of the inverter circuit, $V_{OUT}$, is coupled to the drains 42 and 43 of the p-channel and n-channel transistors, respectively.

Parasitic bipolar transistors 49 and 50 are created by the inverter circuit of FIG. 4. As can be seen, pnp transistor 49 comprises p-type drain 42 and source 41 acting as a dual emitter of bipolar transistor 49, n-region 47 acting as the base, and p-region 46 acting as the collector. The npn bipolar transistor 50 comprises n-type drain 43 and source 44 acting as a dual emitter, p-region 46 acting as the base, and n-region 47 acting as the collector. The resistor 48 represents the substrate resistance Rsub between the tap 40 to n-region 47 and the base of bipolar transistor 49. Likewise, the resistor 51 represents the well resistance Rwell between tap 45 to p-region 46 and the base of bipolar transistor 50.

FIG. 5 has been provided to illustrate a more simplistic view of the circuit formed by the parasitic bipolar devices within the substrate of FIG. 4. $V_{DD}$ is coupled to the emitter of pnp bipolar transistor 49 and to the base of transistor 49 through resistor 48, Rsub. The collector of transistor 49 is coupled to the base of npn bipolar transistor 50 while the base of transistor 49 is coupled to the collector of transistor 50. The base of transistor 50 is coupled to $V_{SS}$ through resistor 51, Rwell, while the emitter of transistor 50 is coupled directly to $V_{SS}$.

In order for the inverter circuit of FIG. 4 to latchup, the emitter-base junctions of the parasitic bipolar transistors 49 and 50 need to be forward biased. By turning on the bipolar transistors 49 and 50, a low resistance path is created between supply voltage $V_{DD}$ and $V_{SS}$ causing latchup current $I_L$ to flow through the parasitic bipolar circuit of FIG. 5. There are a number of ways in which one may induce a latchup condition. Parasitic bipolar transistors 49 and 50 may be induced into a latchup condition by forward biasing the emitter-base junction of either transistor. This will cause the emitter-base junction of the other parasitic bipolar transistor to also go into a forward biased mode, thereby inducing latchup. As can be seen in FIG. 4, the emitter-base junction of parasitic bipolar transistor 49 may be forward biased by raising the voltage of either emitter 41 or 42 above the voltage of n-region 47. In other words, forward biasing either pn diode formed by the source 41 or the drain 42 of the p-channel transistor of the inverter circuit in FIG. 4 will forward bias the emitter-base junction of parasitic bipolar transistor 49, thereby causing latchup to occur. Alternatively, the emitter-base junction of parasitic bipolar transistor 50 may be forward biased by lowering the voltage at either emitter 43 or 44 below the voltage of p-region 46. In other words, forward biasing either pn diode formed by the drain 43 or the source 44 of the n-channel transistor in the inverter circuit of FIG. 4 by lowering the voltage of drain 43 or source 44 below the well potential will forward bias the emitter-base junction of parasitic bipolar transistor 50, thereby causing latchup to occur.

Another method for causing latchup of the circuit of FIG. 4 is to cause avalanche breakdown of the well-substrate junction between p-well 46 and n-type substrate 47. Avalanche breakdown of the well to substrate junction may be caused by increasing the voltage potential between $V_{DD}$ and $V_{SS}$ beyond the breakdown voltage of the well-substrate junction. When avalanche breakdown occurs between the well 46 and the substrate 47, current flows through the substrate between the substrate tap 40 and well tap 45. This current causes a voltage drop across resistors 48 and 51. The voltage across resistor 48 causes the voltage at the base of parasitic bipolar transistor 49 to fall below the voltage at the emitter of transistor 49, thereby forward biasing this emitter-base junction and inducing latchup as discussed above. In addition, the voltage drop across resistor 51 serves to raise the voltage at the base of parasitic bipolar transistor 50 above the voltage at the emitter of transistor 50, thereby turning on transistor 50 and inducing latchup as described above.

Another way to cause latchup to occur is to cause a current to be shunted between the emitter and collector of one of the parasitic bipolar transistors. One method of causing current to be shunted between an emitter and collector of a parasitic bipolar transistor is to allow avalanche ionization to occur at the drain of the associated MOS transistor of the inverter circuit. For example, hot electron effects may cause avalanche ionization near the drain 43 of the n-channel transistor of the inverter circuit of FIG. 4. Such ionization can cause a current to flow freely between the collector 47 and emitters 43 and 44 of parasitic bipolar transistor 50. This a current induces a voltage drop across resistor 48 between the base of parasitic bipolar transistor 49 and n-region tap 40. As a result, the emitter-base junction of bipolar transistor 49 becomes forward biased thereby turning on bipolar transistor 49 and inducing latchup to occur as discussed above. Therefore, by allowing avalanche or impact ionization to occur near the drain of the n-channel transistor of FIG. 4, the circuit of FIG. 4 latches up.

By inducing latchup, a large current may be generated virtually anywhere within an integrated circuit by proper biasing of an inverter circuit. Because the transistors used to generate the large latchup current are parasitic bipolar transistors existing substantially beneath the surface of the semiconductor substrate, the limited, active surface area of the semiconductor substrate is not significantly sacrificed. In fact, depending on the practitioner's requirements, minimum dimension transistors may be used to create the necessary parasitic bipolar transistors used in the latchup mechanism. In addition, it is not necessary to provide special voltage levels to the $V_{DD}$ or $V_{SS}$ nodes in order to generate high latchup currents. Therefore, conventional power supplies may be utilized in conjunction with the present invention.

FIG. 6 illustrates how one might utilize the latchup phenomenon described above to create a latchup fuse in one embodiment of the present invention. As can be seen in FIG. 6, an inverter 63 whose input is coupled to ground is used to control the gate voltage of transistor 61. In accordance with the present invention, n-channel transistor 61 and the n-channel transistor in inverter 63 are built within the same p-well. The input node at $V_{IN}$ is coupled to the drain of transistor 61 through conductive line 65. The source of transistor 61 is coupled to fuse 62 which, in turn, is coupled to the output node at $V_{OUT}$. Fuse 62 comprises a conductive material having dimensions such that upon conducting a latchup current, the material will electrically open, thereby blowing the fuse. By properly biasing inverter circuit 63, as described above, a latchup current may be induced which is forced through the p-well and up into the source of transistor 61, blowing fuse 62. Inverter 63, transistor 61, and fuse 62 are collectively represented as latchup fuse 60 in the schematic representation 64 of FIG. 6.

In accordance with the present invention, latchup fuse 60 may be used to replace virtually any conventional fuse in an IC device such as the prior art fuses illustrated in FIGS. 2 and 3 described above. Latchup fuse 60, however, has the added advantage of being compact, capable of being placed anywhere in an IC, and capable of utilizing a single voltage supply (such as a conventional 5 volt supply) to generate the large current necessary to blow the fuse. If latchup is not induced in inverter 63, the input voltage to the latchup fuse $V_{IN}$ is shunted to the output node of the latchup fuse $V_{OUT}$ through pass through transistor 61 whose gate is coupled to the normally high output of inverter 63. Once latchup is induced, however, input voltage $V_{IN}$ will be electrically isolated from $V_{OUT}$ by blowing fuse 62.

It is to be appreciated by one skilled in the art that alternate circuits may easily be constructed to generate the latchup current needed to blow a fuse, and the fuse may be placed in alternate positions within the circuit. For example, in one embodiment, the circuit is configured such that blowing the fuse effectively turns off a pass-through transistor by applying an appropriate voltage (or lack thereof) to its gate. Note that virtually any pn diode in an n-region adjacent to another pn diode in a p-region comprises the parasitic bipolar transistors necessary to sustain a latchup current. Therefore, in an alternate embodiment, latchup is induced using a structure which comprises the necessary pn diode regions, but may not be configured as an inverter circuit.

In another application, latchup fuses are used to trim the resistors of operational amplifier (OpAmp) circuits. FIG. 7 illustrates a conventional OpAmp configuration in which the input voltage $V_{IN}$ is coupled to OpAmp 72 through input resistor 70. The negative input terminal 73 is coupled to output terminal 75 through feedback resistor 71. Output terminal 75 carries the output voltage $V_{OUT}$ of the circuit. The positive terminal 74 of OpAmp 72 is coupled to ground. Standard analysis of the OpAmp circuit of FIG. 7 may be used to determine that the gain of the circuit (the output voltage, $V_{OUT}$, divided by the input voltage, $V_{IN}$) is proportional to the feedback resistance 71 divided by the input resistance 70. In certain analog circuit implementations, it is necessary to control this gain to within, perhaps, a 5% margin. However, the process used to create the resistors 70 and 71 may cause variation in resistance by as much as 20%. Therefore, it is necessary to be able to adjust the resistance of resistors 70 and 71 after the circuit has been fabricated in order to attain the proper gain of the OpAmp circuit.

FIG. 8 illustrates an embodiment of the present invention which allows one to adjust the overall resistance between nodes 80 and 87 using latchup fuses. Such an embodiment may be employed in conjunction with the circuit of FIG. 7 to achieve the required resistance values for resistors 70 and 71. The structure of FIG. 8 is known as a variable resistance ladder. Note that each rung in the ladder, 84, 85, and 86, contributes a certain amount of resistance to the overall resistance as measured between nodes 80 and 87. Examining rung 84 of the variable resistance ladder, it can be seen that a latchup fuse 82 is placed in series with a resistor 83. This latchup fuse and resistor pair are then placed in parallel with similar latchup fuse and resistor pairs coupling node 80 to node 81. By selectively blowing latchup fuses along rung 84 of the variable resistance ladder, any resistor which is coupled to a blown latchup fuse will be disengaged from the current path connecting node 80 to node 81. Therefore, with each latchup fuse of rung 84 that is selectively blown, the resistance between node 80 and 81 is slightly increased. In this manner, the overall resistance between node 80 and 87 may be incrementally adjusted by selectively blowing particular latchup fuses to obtain the overall required resistance. The number of rungs and fuse/resistor pairs in the variable resistance ladder will vary according to the practitioner's particular requirements.

Alternatively, latchup fuses may be used to destroy the IC device in which they reside. This may be accomplished by causing key parasitic bipolar transistors within the semiconductor substrate of the IC device to latchup, thereby causing key interconnect lines, such as bus lines or input/output lines, to blow open. This implementation of the present invention may be desirable to, for example, destroy IC devices which fail certain testing parameters before throwing the failed devices in the garbage. In doing so, others are prevented from reclaiming and using these substandard devices. Also, a designer may wish to incorporate circuitry in an IC device which triggers latchup biasing to destroy the device upon detecting that the device is being tampered with. So, for example, if one attempted to decode proprietary information within an IC device, the device would be destroyed, thereby preventing any sensitive information from being revealed. Alternatively, one may wish to prevent an IC device user from accessing information within an IC device by blowing a fuse to restrict external, electrical coupling to said information while still allowing the IC to function properly.

Only a mere sampling of the multitude of embodiments in which the present invention may be practiced have been described herein. One skilled in the art can certainly appreciate and implement many alternate embodiments in which the present invention may be practiced. Basically, one may employ the teachings of the present invention to program or otherwise permanently alter an interconnection of any CMOS IC device. Thus, a method for blowing a fuse using the current generated by latchup has been described. The method of inducing a latchup current to blow a fuse has significant advantages over older fuse blowing methods and may be employed in a wide variety of applications, a few of which have been described.

What is claimed is:

1. A method of blowing a fuse formed in the logic of a CMOS integrated circuit which includes an inverter disposed on a semiconductor substrate, said method comprising the steps of:

forming said inverter by forming a n-channel transistor disposed in a p-region of said semiconductor substrate adjacent to a p-channel transistor, said p-channel transistor being disposed in a n-region of said semiconductor substrate such that a parasitic bipolar transistor is formed therebetween;

forming said fuse coupled to said inverter;

raising an output node of said inverter to a potential which is higher than an existing potential of said n-region;

forward biasing a source/drain region of either said n-channel or p-channel transistors, said forward biasing and raising steps turning on said parasitic bipolar transistor, thereby causing a latchup current to flow through said fuse, said latchup current being sufficiently large as to blow said fuse.

* * * * *